(12) United States Patent
Koshikawa

(10) Patent No.: US 6,452,844 B2
(45) Date of Patent: Sep. 17, 2002

(54) SEMICONDUCTOR STORAGE DEVICE HAVING REDUNDANCY CIRCUIT FOR REPLACEMENT OF DEFECT CELLS UNDER TESTS

(75) Inventor: Yasuji Koshikawa, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/739,490

(22) Filed: Dec. 18, 2000

(30) Foreign Application Priority Data

Dec. 24, 1999 (JP) ............................................. 11-368427
Mar. 27, 2000 (JP) ........................................ 2000-087458

(51) Int. Cl.$^7$ ................................................. G11C 7/00
(52) U.S. Cl. .................................. 365/200; 369/189.04
(58) Field of Search ............................. 365/200, 189.04

(56) References Cited

U.S. PATENT DOCUMENTS 5,148,398 A * 9/1992 Kohno ......................... 365/201
5,402,376 A * 3/1995 Horiguchi et al. ........... 365/200
6,202,179 B1 * 3/2001 Morzano ..................... 714/710

FOREIGN PATENT DOCUMENTS

JP 0033431 * 3/1977 ............ G11C/29/00

OTHER PUBLICATIONS

Betty Prince, "Semiconductor Memories", 1983, Wisley, 2$^{nd}$ Edition, pp. 762–765.*

* cited by examiner

Primary Examiner—M. Tran
(74) Attorney, Agent, or Firm—Hayes Soloway P.C.

(57) ABSTRACT

A semiconductor storage device such as a DRAM is configured to enable testing on defectiveness of memory cells by an existing memory tester, which locates defect cells to be replaced with redundancy cells by a redundancy circuit. Herein, a write circuit writes multiple-bit data to memory cells of a memory cell array under testing. Then, the multiple-bit data are read from the memory cell array by a read circuit and are compared with original one to make decisions of "pass" or "fail" on the memory cells by the memory tester. Specifically, the read circuit is configured by plural pairs of a data output circuit and a data compression circuit with respect to plural sets of prescribed data each of which consists of a prescribed number of bits corresponding to prescribed memory cells which are subjected to simultaneous replacement. The data compression circuit is configured by an exclusive-or circuit that compresses a certain type of the prescribed data to specific data having a specific logical value. Or, the data compression circuit is configured using two exclusive-or circuits that compress different types of the prescribed data to specific data. The specific data is forwarded as single-bit data, based on which the memory tester makes decisions of "pass" or "fail" on the memory cells corresponding to bits of the prescribed data being read out.

21 Claims, 9 Drawing Sheets

SEMICONDUCTOR STORAGE DEVICE HAVING REDUNDANCY CIRCUIT FOR REPLACEMENT OF DEFECT CELLS UNDER TESTS

BACKGROUND OF THE INVENTION

1. Field of the Invention

This invention relates to semiconductor storage devices such as dynamic random-access memories (DRAMs) having redundancy circuits for relief from faults, and particularly to semiconductor storage devices in which defect cells are replaced with redundancy cells under testing of memory testers.

2. Description of the Related Art

Conventionally, semiconductor storage devices having large storage capacities such as DRAMs install redundancy circuits for relief from defect cells, which are to be replaced with redundancy cells to improve yields in manufacture. To achieve relief from defect cells by the redundancy circuits, the semiconductor storage devices are placed under tests by memory testers to detect failure addresses in advance, so that the failure addresses are subjected to programming to fuse circuits inside of the redundancy circuits. In normal read/write operations of the semiconductor storage devices, if addresses given from the external match with preprogrammed failure addresses, the semiconductor storage devices are inhibited from selecting regular cells (i.e., defect cells) specified by the failure addresses so that redundancy cells are being selected instead. Thus, it is possible to realize relief from faults by replacing the defect cells with the redundancy cells.

Memory cell arrays such as semiconductor storage devices having multiple-bit configurations (16-bit configurations) realize replacement of defect cells with redundancy cells such that multiple memory cells storing data corresponding to different I/O ports are simultaneously replaced at one time. Suppose a semiconductor storage device which is configured to store 16-bit data DQ0 to DQ15. Herein, consecutive four data are simultaneously subjected to replacement. That is, simultaneous replacement is performed on four data (or four bits) DQ0-DQ3, DQ4-DQ7, DQ8-DQ11 and DQ12-DQ15 respectively.

Generally speaking, the memory testers are used to test functions of the semiconductor memory cells by prescribed operations, as follows:

Data is written to and read from the semiconductor storage device with respect to each of addresses. Then, a check is made as to whether read data matches with an expected value or not. Thus, check results are obtained with respect to all addresses and are then stored in a fail memory of the memory tester. Using data of the check results stored in the fail memory of the memory tester, it is possible to specify failure addresses which fail to perform normal read/write operations.

There are provided two kinds of methods for storing data of check results in the fail memory of the memory tester, which will be described with reference to FIGS. 8 and 9.

That is, FIG. 8 shows a first method in which a data check unit 401 provided inside of a memory tester 400 performs checking as to whether 16-bit data DQ0-DQ15 output from a semiconductor storage device 300, which is a tested subject, match with expected values or not. Thus, the data check unit 401 obtains check results with respect to all bits, so that the check results are stored in a fail memory 402 within the memory tester 400 as its test results.

FIG. 9 shows a second method in which as similar to the first method, a data check unit 411 provided inside of a memory tester 410 performs checking on 16-bit data DQ0-DQ1 output from a semiconductor storage device 300, so that check results are produced with respect to all bits. The check results are subjected to compression by a data compression unit 412 and are then stored in a fail memory 413 within the memory tester 410. As described before, simultaneous replacement for replacing plural defect cells with plural redundancy cells is performed by a redundancy circuit with respect to plural data, namely four bits such as DQ0-DQ3. Herein, it is needless to recognize which of the four bits actually fails within the prescribed four bits. In other words, it is sufficient to recognize that a fault occurs on any one of the prescribed four bits. For this reason, the data compression unit 412 performs compression by each unit of plural bits which are simultaneously placed under replacement by the redundancy circuit. Thus, it is possible to obtain necessary and sufficient information for relief from defect cells. As compared with the first method shown in FIG. 8, the second method shown in FIG. 9 is advantageous in that a capacity of the fail memory can be reduced.

According to the conventional technology, however, the aforementioned semiconductor storage device directly outputs multiple-bit data (e.g., DQ0-DQ15), regardless of a number of bits being placed under replacement by the redundancy circuit. This causes a problem in that manufacturer needs capital investment to facilitate developments and improvements of memory testers in response to increases of semiconductor storage devices in scale and capacity.

In the case of FIG. 8, for example, it is necessary to store in the fail memory 402 all the check results which are produced by the data check unit 401 with respect to all bits DQ0-DQ15 output from the semiconductor storage device 300. This requires an extension of the fail memory 402 in capacity in response to an increase of the semiconductor storage device 300 in scale and capacity. In the case of FIG. 9, the memory tester 410 is designed to compress the check results which are produced by the data check unit 411 with respect to all bits DQ0-DQ15 output from the semiconductor storage device 300. Hence, it is necessary to provide the memory tester 410 with data compression functions (namely, data compression unit 412).

SUMMARY OF THE INVENTION

It is an object of the invention to provide a semiconductor storage device that is capable of producing data used for checking defectiveness to specify defect cells being replaced with redundancy cells without arranging capital investment on memory testers to develop and improve functions.

This invention provides a semiconductor storage device such as a DRAM which is configured to enable testing on defectiveness of memory cells by an existing memory tester, which locates defect cells to be replaced with redundancy cells by a redundancy circuit. Herein, a write circuit writes multiple-bit data to memory cells of a memory cell array under testing. Then, the multiple-bit data are read from the memory cell array by a read circuit and are compared with original one to make decisions of "pass" or "fail" on the memory cells by the memory tester. Specifically, the read circuit is configured by plural pairs of a data output circuit and a data compression circuit with respect to plural sets of prescribed data constructing the multiple-bit data read from the memory cell array. For example, the multiple-bit data consists of sixteen bits (DQ0-DQ15) while each prescribed data consists of four bits (e.g., DQ0-DQ3) corresponding to prescribed memory cells which are subjected to simultaneous replacement.

The data compression circuit is configured by an exclusive-or circuit that compresses the prescribed data to specific data having a specific logical value if the prescribed data has a prescribed data pattern. Or, the data compression circuit is configured using two exclusive-or circuits that compress different types of the prescribed data to specific data. Namely, a first exclusive-or circuit compresses a first type of the prescribed data whose bits are all set to a same logical value to the specific data, while a second exclusive-or circuit compresses a second type of the prescribed data consisting of bits corresponding to a combination of different logical values to the specific data.

The specific data is forwarded as single-bit data (e.g., DQ0) within the prescribed data which are read from the memory cell array. Using the specific data, the existing memory tester is capable of easily making decisions of "pass" or "fail" on the memory cells corresponding to bits of the prescribed data being read out.

BRIEF DESCRIPTION OF THE DRAWINGS

These and other objects, aspects and embodiments of the present invention will be described in more detail with reference to the following drawing figures, of which.

DESCRIPTION OF THE PREFERRED EMBODIMENTS

Figure 1:
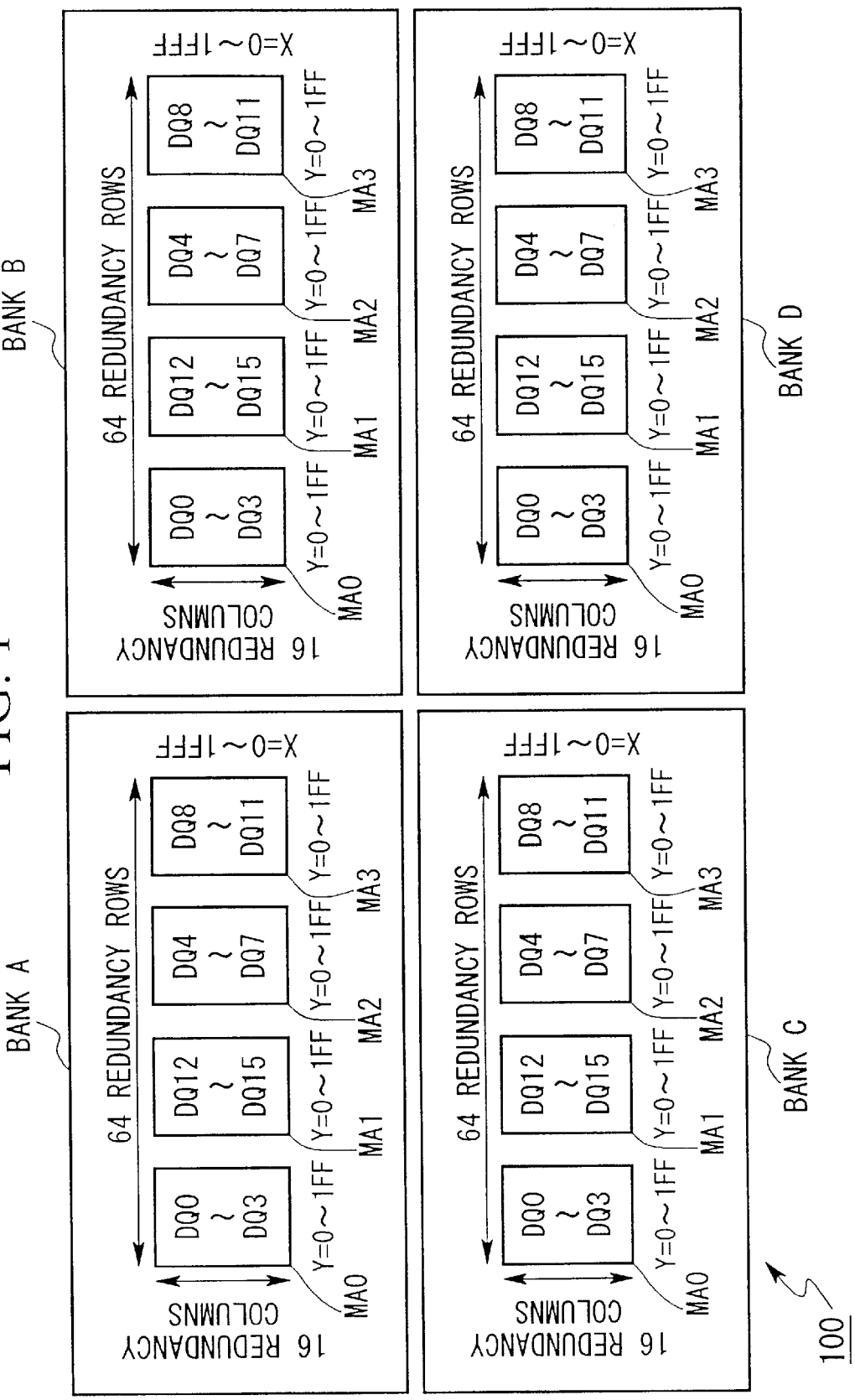
FIG. 1 shows a layout of memory cell arrays in a semiconductor storage device in accordance with a first embodiment of the invention.

This invention will be described in further detail by way of examples with reference to the accompanying drawings.
[A] First Embodiment FIG. 1 shows an outline configuration of a semiconductor storage device 100 having memory cell arrays in accordance with a first embodiment of the invention. The semiconductor storage device 100 is configured as a dynamic random-access memory (DRAM) having redundancy circuit for relief from defect cells. Basically, the semiconductor storage device 100 is configured by four banks, namely, banks A to D. Each bank is designed to store 16-bit data DQ0-DQ15, so that it contains four memory cell arrays MA0 to MA3. Each memory cell array is configured by arranging memory cells in a matrix form, which is defined by a column address space ranging between "0" and "1FF" in hexadecimal notation and a row address space ranging between "0" and "1FF" in hexadecimal notation.

In each bank, 16-bit data DQ0 to DQ15 are divided into four units, which are respectively stored in the memory cell arrays MA0 to MA3. In FIG. 1, a first set of four bits (namely, data DQ0 to DQ3) are stored in a memory cell array MA0, a second set of four bits (namely, date DQ4 to DQ7) are stored in a memory cell array MA2, a third set of four bits (namely, data DQ8 to DQ11) are stored in a memory cell array MA3, and a fourth set of four bits (namely, data DQ12 to DQ15) are stored in a memory cell array MA1.

Total sixty four redundancy rows are provided for four memory cell arrays MA0 to MA3. In addition, sixteen redundancy columns are provided for each of the memory cell arrays.

Figure 2:
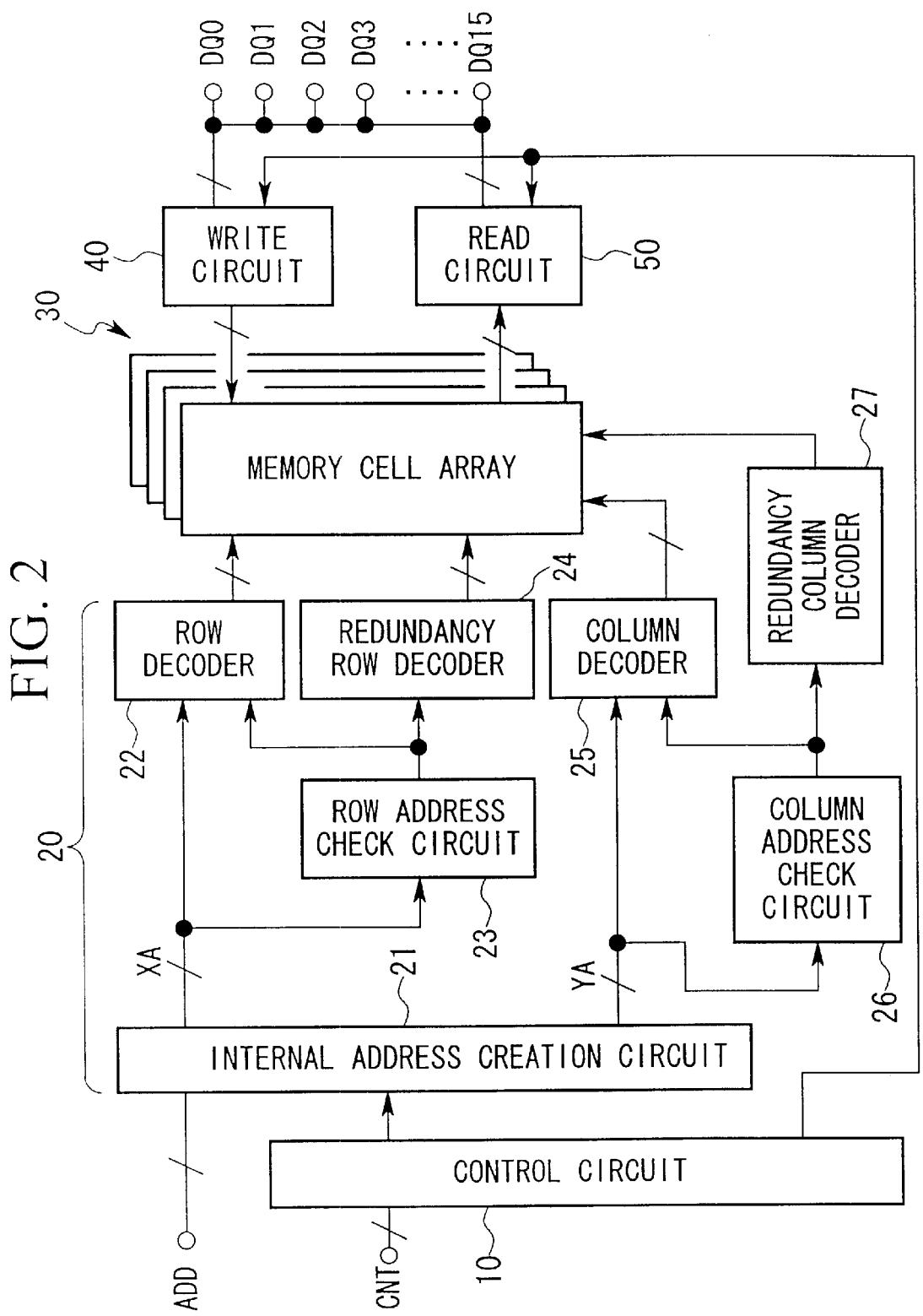
FIG. 2 is a block diagram showing a circuit configuration of the semiconductor storage device with respect to each bank.

FIG. 2 shows a circuit configuration of the semiconductor storage device 100 with respect to each bank. Herein, a control circuit 10 is provided to control read/write operations. Specifically, the control circuit 10 creates internal control signals (which are not specifically designated by reference symbols) in response to operation modes on the basis of control signals CNT given from an external (not shown and specified in FIG. 1).

An address creation system 20 selects memory cells within a memory cell array 30 on the basis of addresses given from the external. Namely, the address creation system 20 is configured by an internal address creation circuit 21, a row decoder 22, a row address check circuit 23, a redundancy row decoder 24, a column decoder 25, a column address check circuit 26 and a redundancy column decoder 27.

In response to address signals ADD supplied from the external, the internal address creation circuit 21 creates row addresses XA and column addresses YA. The row decoder 22 decodes the row addresses XA to select rows of the memory cell array 30, details of which will be described later. The row address check circuit 23 checks whether row addresses designated by the external match with row addresses corresponding to failure addresses or not.

In response to check results of the row address check circuit 23, the redundancy row decoder 24 selects redundancy rows within the memory cell array 30. The column decoder 25 decodes the column addresses YA to select columns of the memory cell array 30. The column address check circuit 26 checks whether column addresses designated by the external match with column addresses corresponding to failure addresses or not. In response to check results of the column address check circuit 26, the redundancy column decoder 27 selects redundancy columns within the memory cell array 30, details of which will be described later.

The row address check circuit 23 installs a fuse circuit for storing row addresses corresponding to failure addresses designating defect cells within the memory cell array 30. In addition, the column address check circuit 26 installs a fuse circuit for storing column addresses corresponding to the failure addresses designating the defect cells within the memory cell array 30. Those circuits function upon programming of the failure addresses to the fuse circuits thereof Under an initial condition where no failure addresses are programmed to the fuse circuits, both of the row address check circuit 23 and column address check circuit 26 are fixedly placed in inactive conditions, therefore, replacement of defect cells with redundancy cells is not performed by redundancy rows and redundancy columns.

The memory cell array 30 generalizes the aforementioned memory cell arrays of the banks A to D shown in FIG. 1. That is, the memory cell array 30 is configured by four sets of the memory cell arrays MA0 to MA3. In the memory cell array 30, each of memory cells is selectively activated under operations of the row decoder 22, redundancy row decoder 24, column decoder 25 and redundancy column decoder 27. A write circuit 40 writes 16-bit data DQ0-DQ15, given from an external (not shown), to the memory cell array 30. A read circuit 50 reads out the 16-bit data DQ0-DQ15 from the memory cell array 30.

Figure 3:
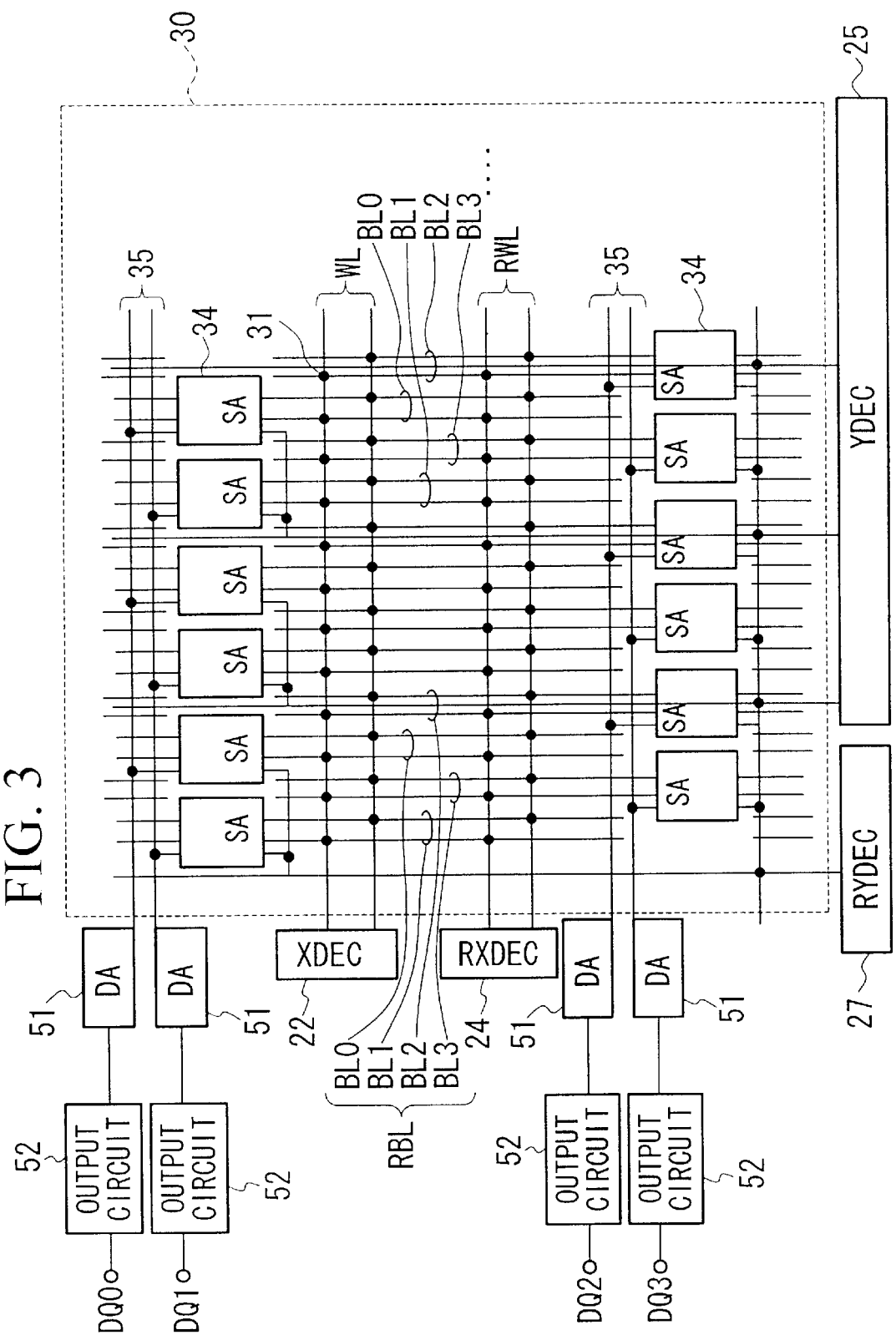
FIG. 3 is a block diagram showing a detailed configuration of a memory cell array and its peripherals in the semiconductor storage device of the first embodiment.

FIG. 3 shows a detailed configuration of the memory cell array 30 and its peripherals. Specifically, FIG. 3 shows a part of the memory cell array 30 which is used to store 4-bit data DQ0-DQ3. Herein, rows and columns of the memory cell array 30 are defined by bit lines and word lines which are regularly wired to cross with each other. As for the columns, there are provided four bit line pairs BL0-BL3 and four redundancy bit line pairs RBL0-RBL3 in connection with four bits DQ0-DQ3 respectively. As for the rows, there are provided word lines WL and redundancy word lines RWL, which are wired horizontally to cross the bit line pairs BL0-BL3 and redundancy bit line pairs RBL0-RBL3. Further, memory cells 31 (see black point marks) are arranged at intersecting points among the word lines and bit line pairs in a prescribed pattern.

The memory cell array 30 contains normal columns and redundancy columns. Herein, the normal columns are defined by repetition of wiring of the bit line pairs BL0-BL3 and are selected by the column decoder (YDEC) 25, while the redundancy columns are defined by the redundancy bit line pairs RBL0-RBL3 and are selected by the redundancy column decoder (RYDEC) 27. In addition, the memory cell array 30 also contains normal rows and redundancy rows. Herein, the normal rows are defined by the word lines WL and are selected by the row decoder (XDEC) 22, while the redundancy rows are defined by the redundancy word lines RWL and are selected by the redundancy row decoder (RXDEC) 24.

Incidentally, the "column" designates memory cells corresponding to a same column address and is defined by any of the known configurations of bit lines such as hierarchical bit lines and a single bit line other than the bit line pairs.

Sense amplifiers SA are connected with ends of bit line pairs respectively. As described before, the memory cell array 30 is actualized by repetition of wiring with respect to each unit of four bit line pairs, which are connected with four sense amplifiers SA respectively. Outputs of the four sense amplifiers SA are respectively supplied to four data amplifiers 51 via 10 buses 35. The data amplifiers 51 amplify them to provide four data DQ0-DQ3 by way of four output circuits 52 respectively. The data amplifiers 51 and output circuits 52 configure essential parts of the aforementioned read circuit 50 shown in FIG. 2.

FIG. 3 shows a partial circuit configuration of the memory cell array 30 which realizes the foregoing memory cell array MA0 (see FIG. 1) for storing four data DQ0-DQ3. Similarly, the memory cell array 30 also contains other circuit configurations which respectively realize the foregoing memory cell arrays MA2, MA3 and MA1 for storing data DQ4-DQ7, data DQ8-DQ11 and data DQ12-DQ15 respectively.

The memory cell array 30 shown in FIG. 3 is configured such that four bit line pairs BL0-BL3, which are wired adjacent to each other, are respectively related to 4-bit data DQ0-DQ3 belonging to prescribed I/O ports which differ from each other. Therefore, the four bit line pairs respectively corresponding to four data DQ0-DQ3 are simultaneously subjected to replacement in which defect cells are to be replaced by redundancy columns or redundancy rows.

Figure 4:
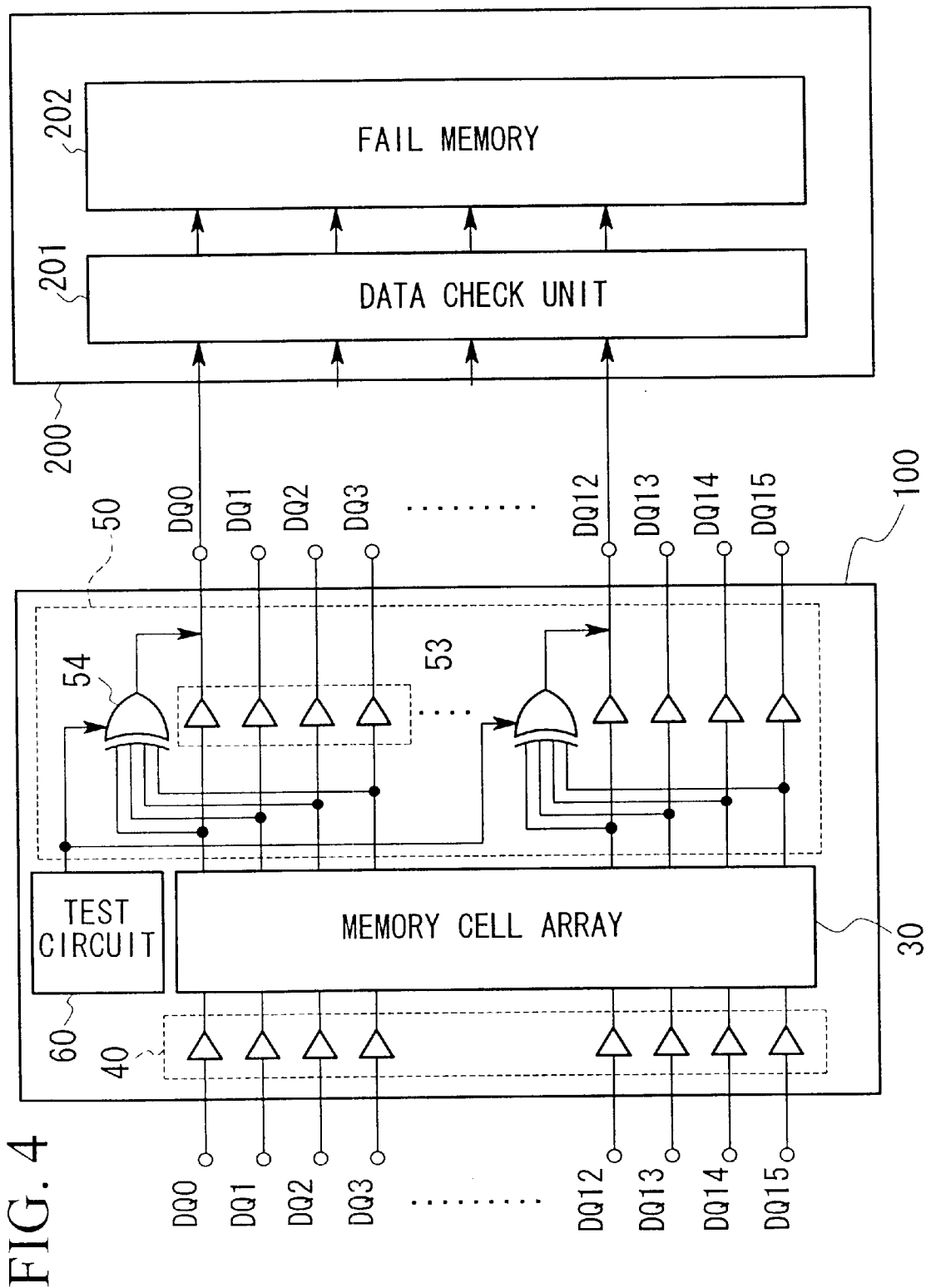
FIG. 4 is a block diagram showing essential parts of the semiconductor storage device coupled with a memory tester.

FIG. 4 shows an internal configuration of the read circuit 50 and an outline configuration of a memory tester 200 which is connected with the semiconductor storage device 100 for testing.

In FIG. 4, the read circuit 50 contains a data output circuit 53 for outputting 4-bit data DQ0-DQ3 being read from the memory cell array 30 and a data compression circuit 54 corresponding to a four-input exclusive-or circuit for compressing the 4-bit data to prescribed data. An output of the data compression circuit 54 is forwarded to a terminal of the data DQ0. Incidentally, the data output circuit 53 corresponds to the aforementioned data amplifiers 51 and output circuits 52 shown in FIG. 3.

Similarly, a pair of the data output circuit and data compression circuit are provided for each of 4-bit data DQ4-DQ7, DQ8-DQ11 and DQ12-DQ15. Outputs of three data compression circuits which are provided for three 4-bit data DQ4-DQ7, DQ8-DQ11 and DQ12-DQI5 respectively are forwarded to terminals of the data DQ4, DQ8 and DQ12, from which they are supplied to the memory tester 200.

A test circuit 60 performs a series of controls to set the semiconductor storage device 100, which is a tested subject, to a test mode. At the test mode, the test circuit 60 activates the data compression circuits 54 while inactivating the data output circuits 53. Each of the data output circuits 53 and the data compression circuits 54 has an output impedance which becomes high when being inactivated under controls of the test circuit 60. Concretely speaking, when the data compression circuit 54 is activated, the output impedance of the data output circuit 53 which is inactivated becomes high under controls of the test circuit 60. Thus, an output of the data compression circuit 54 is directly applied to the terminal of the data DQ0 without being hindered by an output of the data output circuit 53.

Figure 8:
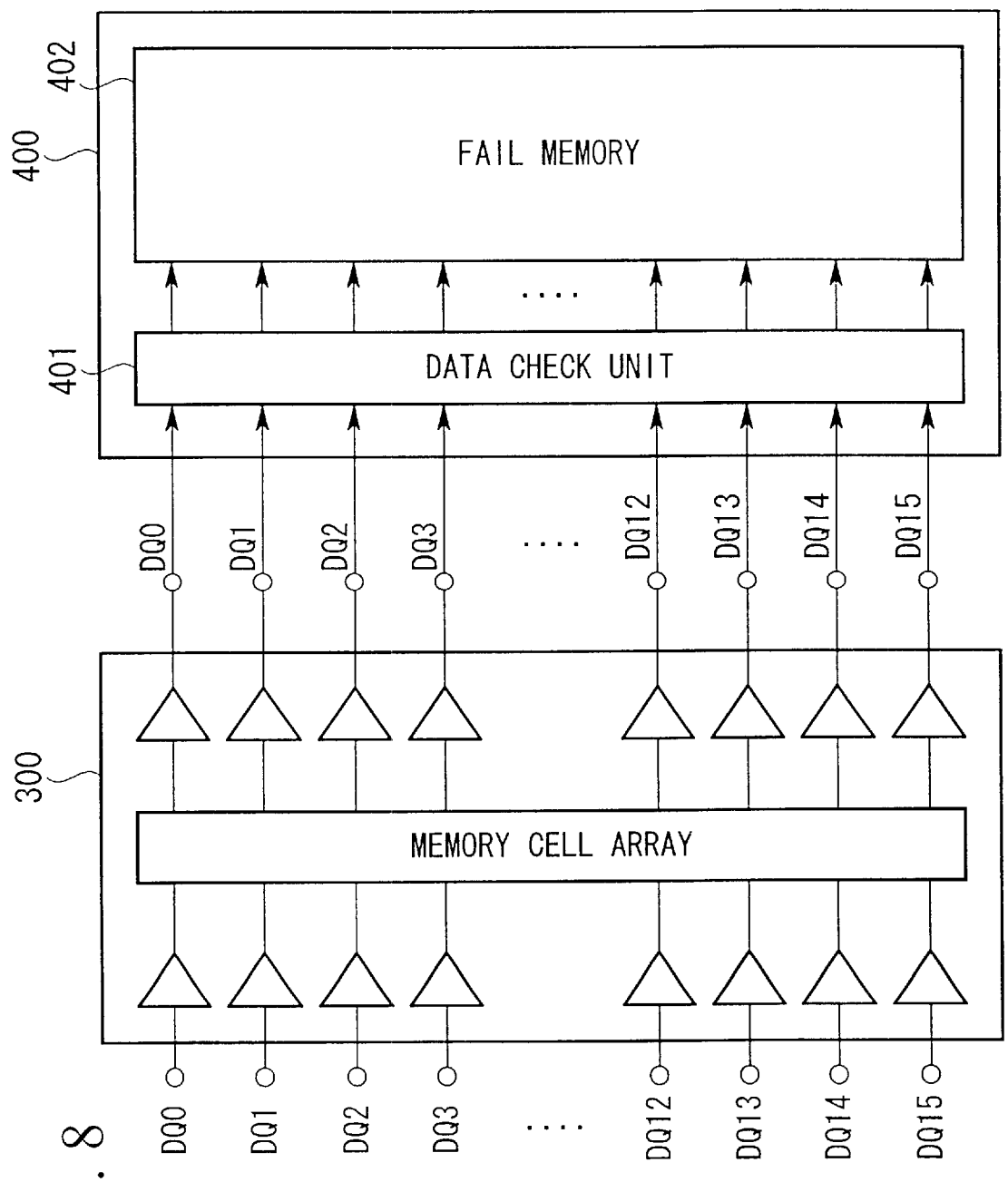
FIG. 8 is a block diagram showing an example of a memory tester that checks a multiple-bit output of a semiconductor storage device.
Figure 9:
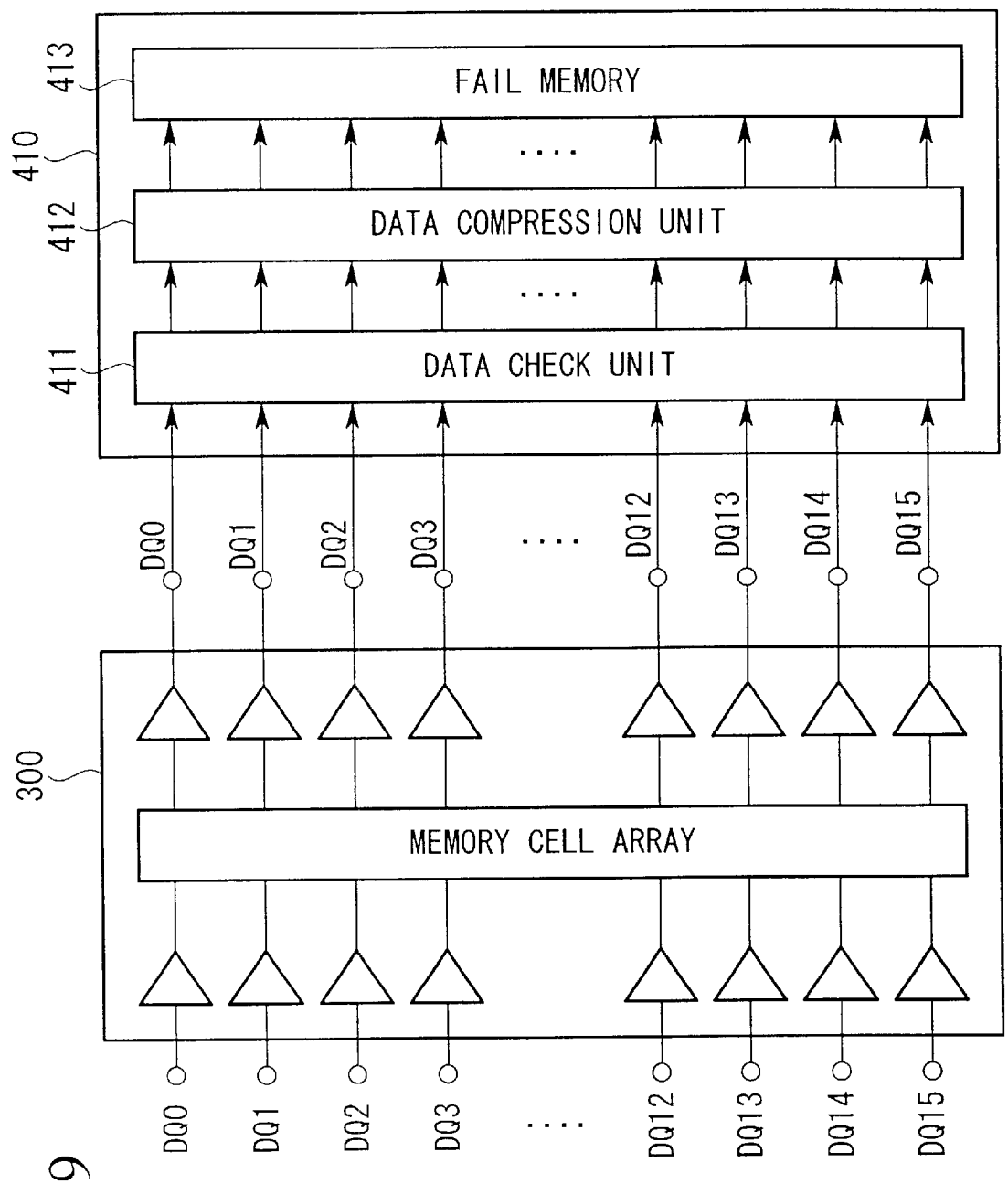
FIG. 9 is a block diagram showing another example of a memory tester that checks a multiple-bit output of a semiconductor storage device.

The memory tester 200 shown in FIG. 4 contains a data check unit 201 and a fail memory 202. The data check unit 201 checks whether output data of the semiconductor storage device 100 match with expected values or not. The fail memory 202 stores check results produced by the data check unit 201. Basically, the memory tester 200 functions as similar to the foregoing memory tester 400 used for the conventional semiconductor storage device shown in FIG. 8. FIG. 4 omits detailed illustration regarding prescribed functions of the memory tester 200 for generating addresses together with data. That is, the memory tester 200 generates and outputs addresses and data to the semiconductor storage device 100 in accordance with content of testing.

Next, operations of the semiconductor storage device 100 of the present embodiment will be described with reference to FIG. 4. Herein, the description is made with respect to an example of testing which is performed by the memory tester 200 to obtain failure addresses locating defect cells in view of operations of the read circuit 50.

When a signal from an external (not shown) is applied to a prescribed terminal of the semiconductor storage device 100 at a certain timing, the data compression circuit 54 is activated while the data output circuit 53 is inactivated under controls of the test circuit 60.

Then, the memory tester 200 writes data to the semiconductor storage device 100. Concretely speaking, the memory tester 200 designates addresses, so that 16-bit data consisting of bits DQ0-DQ15 which are set to a same logical value is written to the memory cell array 30 by way of the write circuit 40 in the semiconductor storage device 100. Herein, all bits of the 16-bit data DQ0-DQ15 are not necessarily set to the same logical value (i.e., logical "1" or "0"), in other words, the present system merely requires that at least four consecutive bits, which are subjected to simultaneous replacement, are set to the same logical value. For example, all bits of 4-bit data DQ0-DQ3 and all bits of 4-bit data DQ8-DQ11 are set to a same logical "1", while all bits of 4-bit data DQ4-DQ7 and all bits of 4-bit data DQ12-DQ15 are set to a same logical "0". In short, it is possible to arbitrarily set logical values, which are set to consecutive bits of the data in response to content of testing.

After completion of the writing operation to write the 16-bit data DQ0-DQ15 to the memory cell array 30, the memory tester 200 performs a read operation on the semiconductor storage device 100. Concretely speaking, the address creation system 20 (see FIG. 2) selectively designates memory cells of the memory cell array 30, which are activated to read out data. At this time, no failure addresses are programmed to the row address check circuit 23 and the column address check circuit 26. That is, those circuits are fixedly placed in inactive conditions, so that data are read from the "normal" memory cells of the memory cell array 30.

In the semiconductor storage device 100 shown in FIG. 4, 4-bit data DQ0-DQ3 is read from the memory cell array 30 and is supplied to the data compression circuit 54 of the read circuit 50, wherein the 4-bit data is compressed to 1-bit data. That is, the 4-bit data whose bits are subjected to simultaneous replacement is compressed to the 1-bit data.

The data compression circuit 54 functions to compress only prescribed data (e.g., 4-bit data DQ0-DQ3 or data of a prescribed number of bits being read from the memory cell array 30) to specific data. Concretely speaking, the data compression circuit 54 performs an exclusive-or operation on the 4-bit data read from the memory cell array 30, wherein the data compression circuit 54 produces 1-bit data of a logical "0" if all bits of the 4-bit data have a same logical value or it produces 1-bit data of a logical "1" if at least one bit of the 4-bit data differs from other bits in logical value. The 1-bit data is forwarded to a terminal of data DQ0.

Similarly, the other data compression circuits (not shown specifically in FIG. 4) compress 4-bit data DQ4-DQ7, 4-bit data DQ8-DQ11 and 4-bit data DQ12-DQ15 respectively, so that three 1-bit data are produced and forwarded to three terminals of data DQ4, DQ8 and DQ12 respectively. In result, the data compression circuits 54 produce four compressed data, which are supplied to the memory tester 200 as data DQ0, DQ4, DQ8 and DQ12 respectively.

Thus, the memory tester 200 inputs the compressed data from the semiconductor storage device 100 as the data DQ0, DQ4, DQ8 and DQ12, which are forwarded to the data check unit 201. The data check unit 201 checks whether each of the data matches with an expected value or not. Herein, each data corresponds to a result of compression of the original 4-bit data whose bits are subjected to simultaneous replacement. Hence, the data check unit 201 performs pass/fail data checking by each unit of the 4-bit data whose bits are subjected to simultaneous replacement.

Suppose that the memory tester 200 writes 16-bit data DQ0-DQ15 whose bits are all set to a same logical "1" to the memory cell array 30 of the semiconductor storage device 100. In that case, it is expected that all of the data compression circuits 54 of the read circuit 50 output the same 1-bit data which is set to a logical "0". If the memory cell array 30 does not contain defects, the data check unit 201 determines that all data DQ0, DQ4, DQ8 and DQ 12 output from the semiconductor storage device 100 match with an expected value "0". Thus, the data check unit 201 makes a decision of "pass" on all data output from the semiconductor storage device 100.

Suppose that the memory cell array 30 contains a defect cell corresponding to data DQ3 being read from the memory cell array 30, for example. In this case, the data compression circuit 54 for compressing 4-bit data DQ0-DQ3 produces 1-bit data which is set to a logical "1" and is applied to data DQ0. Within four data DQ0, DQ4, DQ8 and DQ12 that the memory tester 200 inputs from the semiconductor storage device 100, only the data DQ0 has the logical "1", which does not match with the expected value "0". Thus, the data check unit 201 makes a decision of "fail" on the data DQ0.

Because of the known property of the exclusive-or circuit, the data compression circuit 54 produces 1-bit data of a logical "1" if at least one of bits of the 4-bit data DQ0-DQ3 is read from a defect cell in the memory cell array 30. For this reason, it is impossible to make determination, based on an output of the data compression circuit 54, as to which of bits of the 4-bit data DQ0-DQ3 locates a defect.

It is unnecessary to obtain information as to which of plural bits being subjected to simultaneous replacement locates the defect in the memory cell array whose defect cell is to be replaced with a redundancy cell. In other words, it is sufficient to obtain information that any one of the plural bits being subjected to simultaneous replacement locates the defect in the memory cell array. In the aforementioned example in which the defect cell corresponds to the data DQ3, it is unnecessary to specify the data DQ3 locating the defect, in other words, it is sufficient to detect that any one of bits of the 4-bit data DQ0-DQ3 corresponding to a unit of replacement locates the defect. Thus, the present embodiment is capable of effectively specifying failure addresses, which are needed for relief from defect cells, on the basis of the compressed data output from the data compression circuits 54.

According to the present embodiment described above, it is possible to detect a defect mode which causes inconsistency among bits of the 4-bit data input to the data compression circuit 54. Such inconsistency is caused by bit defectiveness in which degeneracy of data occurs by each unit of a memory cell, or it is caused by column defectiveness in which degeneracy of data occurs by each unit of a bit line, for example. Because the present embodiment is designed such that 4-bit data whose bits are subjected to simultaneous replacement is compressed to 1-bit data, it is possible to reduce the fail memory 202 of the memory tester 200 in capacity.

[B] Second Embodiment

Next, a second embodiment of this invention will be described with reference to FIGS. 5 and 6.

Figure 5:
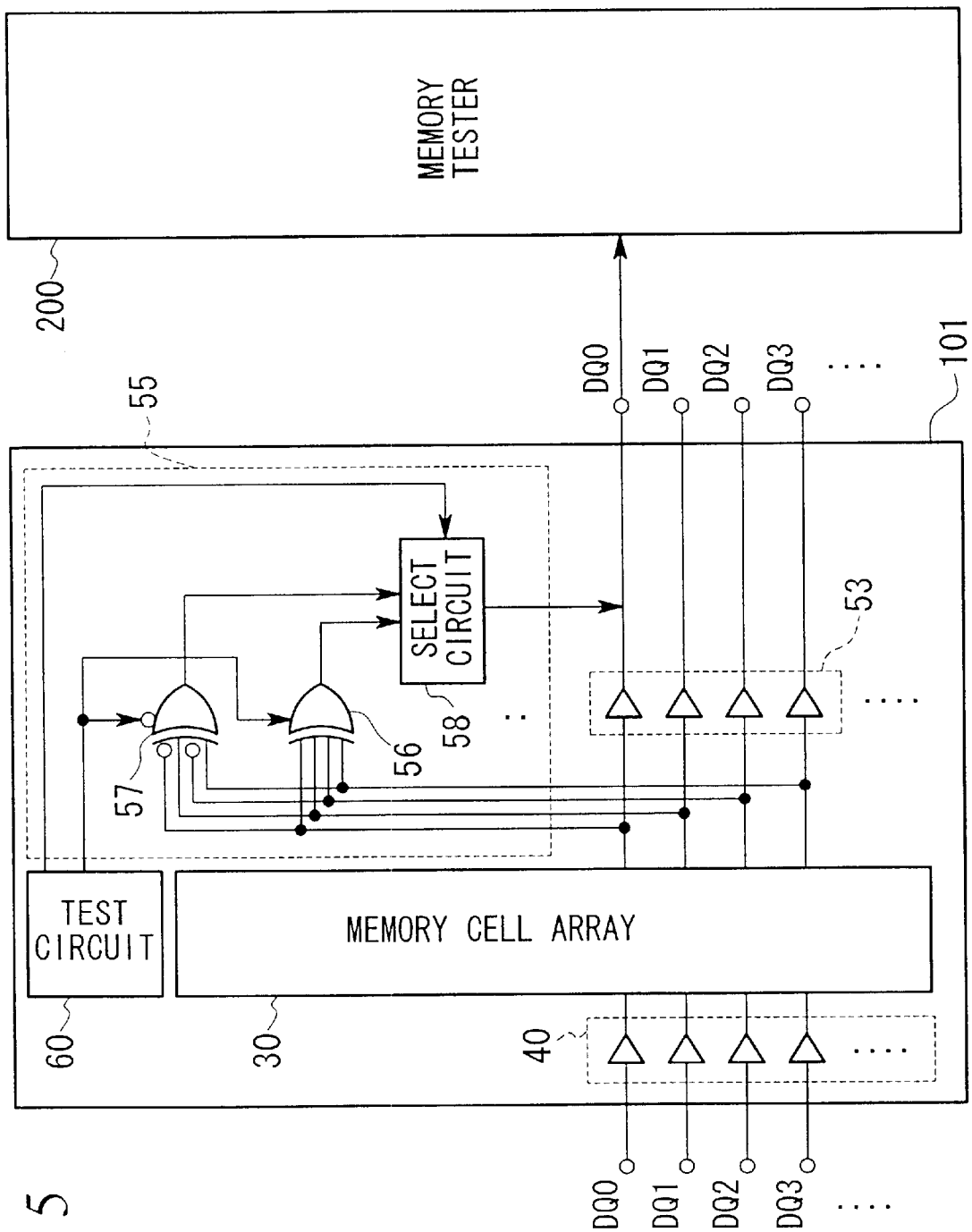
FIG. 5 is a block diagram showing an internal configuration of a semiconductor storage device coupled with a memory tester in accordance with a second embodiment of the invention.

FIG. 5 shows an internal configuration of a semiconductor storage device 101 coupled to a memory tester 200 in accordance with the second embodiment of the invention, wherein parts equivalent to those shown in FIG. 4 are designated by the same reference numerals. As compared with the semiconductor storage device 100 of the first embodiment shown in FIG. 4, the semiconductor storage device 101 of the second embodiment shown in FIG. 5 substitutes a data compression circuit 55 for the data compression circuit 54. FIG. 5 omits detailed illustration, however, there are provided four sets of the data compression circuit 55 in connection with four 4-bit data respectively. The data compression circuit 55 is configured by two exclusive-or circuits 56, 57 and a select circuit 58. Each of the two exclusive-or circuits 56, 57 provides one output and four inputs for inputting four bits of the 4-bit data DQ0-DQ3 respectively, whereas those circuits operate differently from each other. That is, the exclusive-or circuit 56 compresses 4-bit data whose bits are all set to a same logical value, e.g., "0,0,0,0" and "1,1,1,1" in decimal notation, to specific 1-bit data having a logical "0". The exclusive-or circuit 57 having two negated inputs compresses 4-bit data whose bits are not set to a same logical value, e.g., "1,0,1,0" and "0,1,0,1" in decimal notation, to specific 1-bit data. The select circuit 58 selects either an output of the exclusive-or circuit 56 or an output of the exclusive-or circuit 57.

More specifically, the exclusive-or circuit 56 has four positive logic inputs that input four bits of the 4-bit data DQ0-DQ3 being read from the memory cell array 30. The exclusive-or circuit 57 has two positive logic inputs for inputting DQ1 and DQ3 and two negative logic inputs for inputting DQ0 and DQ2 within the 4-bit data DQ0-DQ3 being read from the memory cell array 30. Under controls of the test circuit 60, either the exclusive-or circuit 56 or the exclusive-or circuit 57 selectively operates to perform an exclusive-or operation on the 4-bit data DQ0-DQ3.

Under controls of the test circuit 60, the select circuit 58 selects either an output of the exclusive-or circuit 56 or an output of the exclusive-or circuit 57 which is presently operating. Thus, the data compression circuit 55 outputs one of the outputs of the exclusive-or circuits 56, 57 to a terminal of data DQ0.

Similarly, three data compression circuits are provided for compressing three 4-bit data, namely, 4-bit data DQ4-DQ7, 4-bit data DQ8-DQ11 and 4-bit data DQ12-DQ15 which are read from the memory cell array 30. As similar to the data compression circuit 55 that compresses the 4-bit data DQ0-DQ3, the data compression circuit that compresses the 4-bit data DQ4-DQ7 produces and forwards 1-bit data to a terminal of data DQ4, the data compression circuit that compresses the 4-bit data DQ8-DQ11 produces and forwards 1-bit data to a terminal of data DQ8, and the data compression circuit that compresses the 4-bit data DQ12-DQ15 produces and forwards 1-bit data to a terminal of data DQ12. Thus, the four data compression circuits 55 of the semiconductor storage device 101 outputs four data DQ0, DQ4, DQ8 and DQ12 to the memory tester 200.

At a normal mode where the data output circuit 53 is activated, an output impedance of the select circuit 58 becomes high under control of the test circuit 60. Hence, outputs of the data output circuit 53 provided for normal memory cells are not hindered by an output of the data compression circuit 55. At a test mode, an output impedance of the data output circuit 53 becomes high under control of the test circuit 60, so that the output of the data compression circuit 55 is not hindered by the output of the data output circuit 53.

Figure 6:
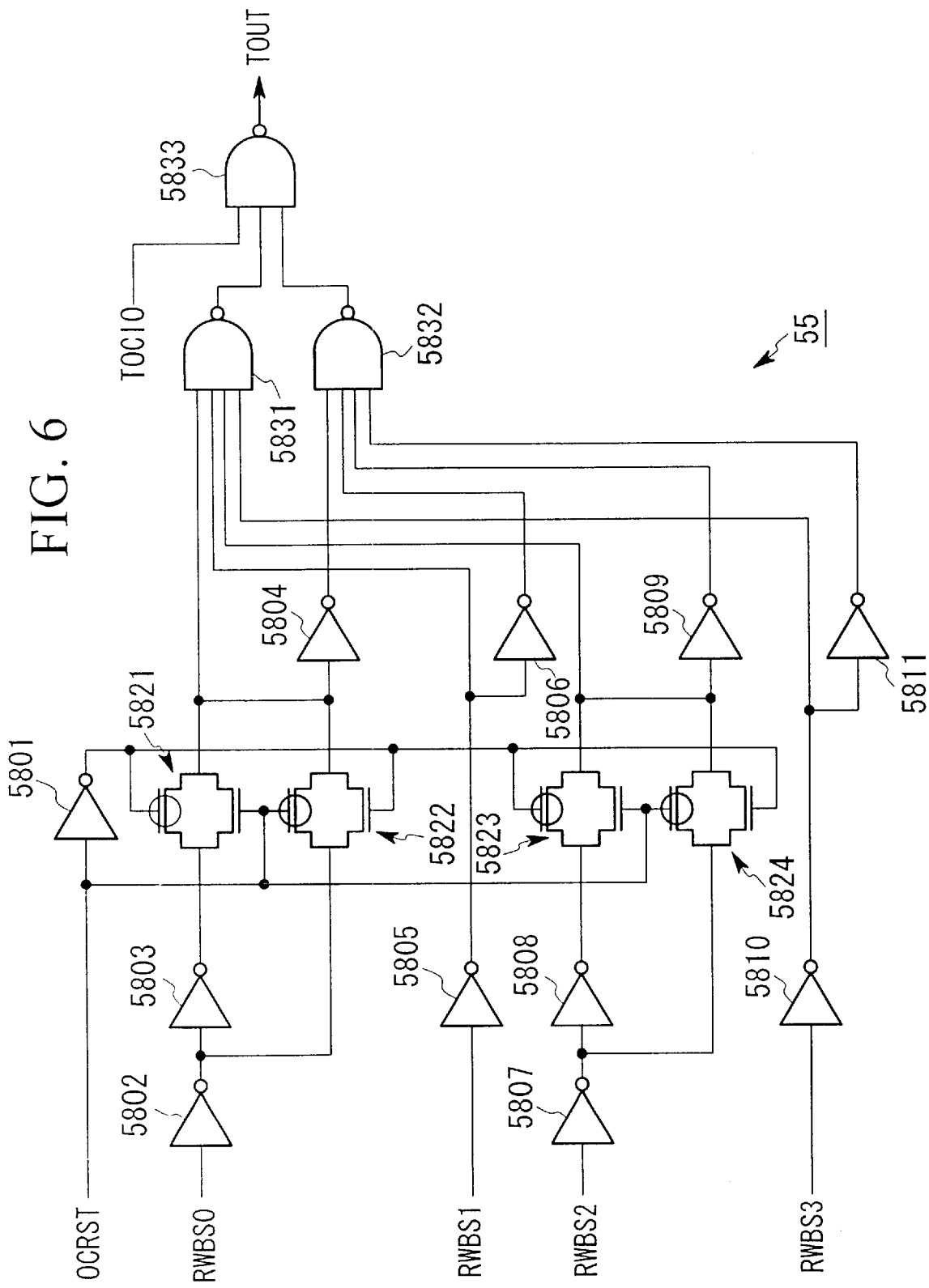
FIG. 6 is a circuit diagram showing an example of a detailed circuit configuration of a data compression circuit which is used in the semiconductor storage device shown in FIG. 5.

FIG. 6 shows an example of a detailed circuit configuration actualizing functions of the data compression circuit 55. In FIG. 6, reference symbols RWBSO to RWBS3 designate lines of a read/write bus for connections between the memory cell array 30 and the data compression circuit 55, a reference symbol OCRST designates a control signal that discriminates data patterns, reference numerals 5801 to 5811 designate inverters, reference numerals 5821 to 5824 designate transfer gates each configured by a pair of a p-type MOS transistor and an n-type MOS transistor, and reference numerals 5831 to 5833 designate NAND circuits. In addition, a reference symbol TOCIO designates a signal which is activated and is set to a logical "1" at the test mode, and a reference symbol TOUT designates an output signal of the data compression circuit 55, namely an selected output signal of the select circuit 58.

In the circuit configuration of FIG. 6, when the control signal OCRST is set at a logical "1", the transfer gates 5821, 5823 are turned ON while the transfer gates 5822, 5824 are turned OFF. Thus, data of four bits respectively applied to the lines RWBS0-RWBS3 of the read/write bus are directly forwarded to four inputs of the NAND circuit 5831, while they are also delivered to four inputs of the NAND circuit 5832 by way of the inverters 5804, 5806, 5809 and 5811. Namely, the NAND circuit 5831 inputs the 4-bit data by positive logic, while the NAND circuit 5832 inputs the 4-bit data by negative logic. As a result, the aforementioned elements of the circuit configuration of FIG. 6 act as the exclusive-or circuit 56.

When the control signal OCRST is set at a logical "0", the transfer gates 5821, 5823 are turned OFF while the transfer gates 5822, 5824 are turned ON. Thus, data of four bits respectively applied to the lines RWBSO-RWBS3 of the read/write bus are forwarded to the four inputs of the NAND circuit 5831 by negative logic, while they are also forwarded to the four inputs of the NAND circuit 5832 by positive logic. As a result, the aforementioned elements of the circuit configuration of FIG. 6 act as the exclusive-or circuit 57.

Next, operations of the second embodiment will be described in further detail.

For convenience sake, each combination of logical values of the 4-bit data DQ0-DQ3 is called a data pattern. The second embodiment performs testing by using four data patterns, namely, "0,0,0,0", "1,1,1,1,", "0,1,0,1" and "1,0,1, 0" in decimal notation.

At first, testing is performed by using two data patterns, namely, "0,0,0,0" and "1,1,1,1". Herein, the test circuit 60 controls the data compression circuit 55 such as to activate the exclusive-or circuit 56 while inactivating the exclusive-or circuit 57, so that an output of the activated exclusive-or circuit 56 is to be selected by the select circuit 58.

Under the aforementioned condition, a data pattern "0,0, 0,0" is written to and then read from the memory cell array 30. If all bits of the 4-bit data DQ0-DQ3 read from the memory cell array 30 are set at a same logical "0", all of four inputs of the exclusive-or circuit 56 match with each other in logical value, so that the exclusive-or circuit 56 produces specific 1-bit data having a logical "0". Therefore, the memory tester receives the logical "0" as data DQ0 so as to make a decision of "pass".

If any one of the bits of the 4-bit data DQ0-DQ3 is set at a logical "1", inconsistency occur among the four inputs of the exclusive-or circuit 56 in logical value, so that the exclusive-or circuit 56 produces 1-bit data having a logical "1". Therefore, the memory tester 200 receives the logical "1" as data DQ0 so as to make a decision of "fail".

As described above, the memory tester 200 completes testing using the data pattern "0,0,0,0".

Similarly, the memory tester 200 performs testing using another data pattern "1,1,1,1". If all of bits of 4-bit data DQ0-DQ3 read from the memory cell array 30 are set at a same logical "1", the exclusive-or circuit 56 produces specific 1-bit data having a logical "0". If any one of the bits of the 4-bit data DQ0-DQ3 is set at a logical "0" due to existence of a defect cell in the memory cell array 30, the exclusiveor circuit 56 produces 1-bit data having a logical "1".

In both of the aforementioned tests using the data patterns "0,0,0,0" and "1,1,1,1", only when all bits of the 4-bit data DQ0-DQ3 read from the memory cell array 30 match with each other in logical value, the data compression circuit 55 outputs the specific 1-bit data having the logical "0", otherwise, it outputs the 1-bit data having the logical "1". In result, it is possible to detect existence of defectiveness that cause failure in storing prescribed data patterns, all bits of which match with each other in logical value, in the memory cell array 30.

Next, the memory tester 200 performs testing using a data pattern "0,1,0,1". In this case, the test circuit 60 controls the data compression circuit 55 such as to activate the exclusive-or circuit 57 while inactivating the exclusive-or circuit 56, so that an output of the activated exclusive-or circuit 57 is to be selected by the select circuit 58.

Under the aforementioned condition, the data pattern "0,1,0,1" is written to and then read from the memory cell array 30. If 4-bit data DQ0-DQ3 read from the memory cell array 30 has the data pattern "0,1,0,1", a logical "0" is input to the exclusive-or circuit 57 by negative logic while a logical "1" is input to the exclusive-or circuit 57 by positive logic. Hence, all of four inputs of the exclusive-or circuit 57 apparently match with each other in logical value, so that the exclusive-or circuit 57 produces specific 1-bit data having a logical "0". Therefore, the memory tester 200 receives the logical "0" as data DQ0 so as to make a decision of "pass".

If the 4-bit data DQ0-DQ3 read from the memory cell array 30 does not have the data pattern "0,1,0,1", inconsistency occur apparently on the four inputs of the exclusive-or circuit 57 in logical value, so that the exclusive-or circuit 57 produces 1-bit data having a logical "1". Therefore, the memory tester 200 receives the logical "1" as data DQ0 so as to make a decision of "fail".

Similarly, the memory tester 200 performs testing using another data pattern "1,0,1,0", which is written to and then read from the memory cell array 30. If 4-bit data DQ0-DQ3 read from the memory cell array 30 has the data pattern "1,0,1,0", a logical "1" is input to the exclusive-or circuit 57 by negative logic while a logical "0" is input to the exclusive-or circuit 57 by positive logic. Hence, all of four inputs of the exclusive-or circuit 57 apparently match with each other in logical value, so that the exclusive-or circuit 57 produces specific 1-bit data having a logical "0", so that the memory tester 200 makes a decision of "pass" on data DQ0. If inconsistency occur on the four inputs of the exclusive-or circuit 57 in logical value, the exclusive-or circuit 57 produces 1-bit data having a logical "1", so that the memory tester 200 makes a decision of "fail" on data DQ0.

In both of the aforementioned tests using the data patterns "0,1,0,1" and "1,0,1,0", only when adjacent bits of the data read from the memory cell array 30 differ from each other in logical value, the data compression circuit 55 outputs the specific 1-bit data having the logical "0". Thus, it is possible to detect existence of defectiveness that causes degeneracy of data of bits which are being degenerated into a same logical value at adjacent bit lines. For example, the defectiveness is caused by short-circuit between adjacent bit lines, or defectiveness occur in each unit of four bit line pairs BL0-BL3 corresponding to a unit of 4-bit data DQ0-DQ3.

According to the second embodiment, the data compression circuit 55 outputs the specific 1-bit data only when different logical values are contained in data of multiple bits being written to adjacent memory cells which are arranged adjacent to each other and which are subjected to simultaneous replacement with redundancy cells. Thus, it is possible to detect degeneracy of data by each unit of multiple cells which are subjected to simultaneous replacement.

The second embodiment is described such that in FIG. 5, the select circuit 58 selects any one of outputs of the exclusive-or circuits 56, 57. It is possible to modify the data compression circuit 55 to exclude the select circuit 58, wherein both of the outputs of the exclusive-or circuits 56, 57 are supplied to the memory tester 200. That is, an output of the exclusive-or circuit 56 is forwarded as data DQ0 while an output of the exclusive-or circuit 57 is forwarded as data DQ1, for example. In this case, the memory tester 200 needs modification in that either the data DQ0 or DQ1 is selected in response to the data pattern applied to the semiconductor storage device 101 under test.

The aforementioned modifications will be described in a more concrete manner. When test data of multiple bits which are all set to a same logical value are applied to the semiconductor storage device 101, the memory tester 200 selects data DQ0, which reflects an output of the exclusive-or circuit 56, to make a decision of "pass" or "fail". When test data of multiple bits which correspond to a combination of different logical values are applied to the semiconductor storage device 101, the memory tester 200 selects data DQ 1, which reflects an output of the exclusive-or circuit 57, to make a decision of "pass" or "fail". Incidentally, determination as to which data is to be selected can be easily realized by installing a prescribed test program in the memory tester 200.

In the aforementioned modifications in which both of the outputs of the exclusive-or circuits 56, 57 are supplied to the memory tester 200, it is possible to exclude the select circuit 58 from the data compression circuit 55 and it is possible to eliminate signals for controlling the select circuit 58 in the data compression circuit 55. Thus, it is possible to simplify the circuit configuration of the data compression circuit 55.

[C] Third Embodiment

Next, a third embodiment of this invention will be described in detail with reference to FIG. 7.

In the second embodiment shown in FIG. 5, the select circuit 58 selects either an output of the exclusive-or circuit 56 or an output of the exclusive-or circuit 57 to provide data DQ0 to the memory tester 200. The third embodiment is designed such that outputs of two exclusive-or circuits are forwarded to different terminals of data.

Figure 7:
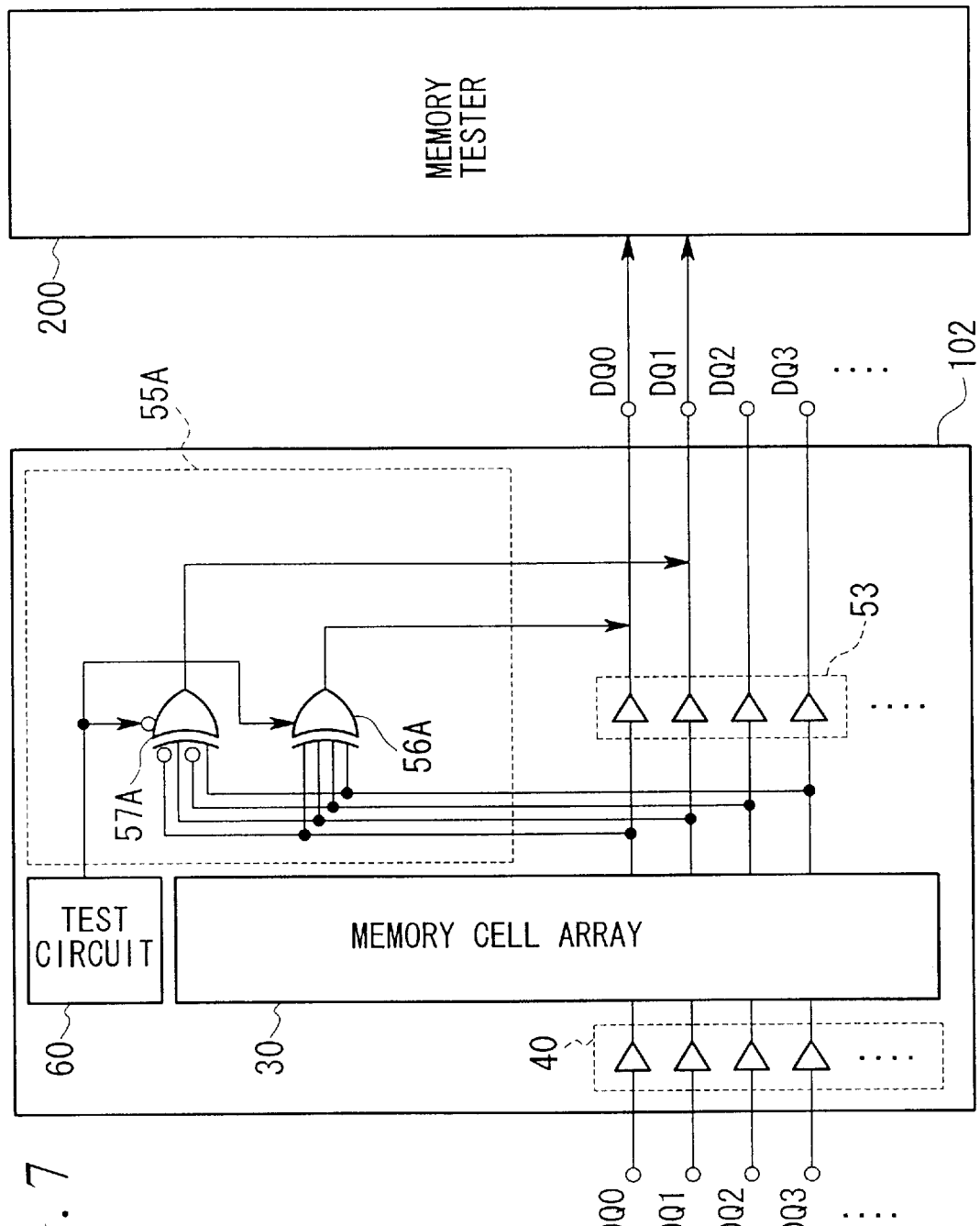
FIG. 7 is a block diagram showing an internal configuration of a semiconductor storage device coupled with a memory tester in accordance with a third embodiment of the invention.

FIG. 7 shows a semiconductor storage device 102 coupled with a memory tester 200 in accordance with the third embodiment of the invention, wherein parts identical to those of the first embodiment shown in FIG. 4 are designated by the same reference numerals. As compared with the semiconductor storage device 100 ofthe first embodiment shown in FIG. 4, the semiconductor storage device 102 of the third embodiment shown in FIG. 7 is characterized by that a data compression circuit 55A configured by two exclusive-or circuits 56A, 57A is provided instead of the data compression circuit 54. The exclusive-or circuits 56A, 57A basically correspond to the aforementioned exclusive-or circuits 56, 57 employed in the second embodiment shown in FIG. 5. That is, under controls of the test circuit 60, the exclusive-or circuits 56A, 57A produce and forward 1-bit data respectively to different terminals. Namely, an output of the exclusive-or circuit 56A is forwarded to a terminal of data DQ0, while an output of the exclusive-or circuit 57A is forwarded to a terminal of data DQ1.

Different from the foregoing embodiments, the third embodiment is designed such that at a normal mode where the data output circuit 53 is activated, both of output impedances of the exclusive-or circuits 56A, 57A become high under controls of the test circuit 60, so that outputs of the data output circuit 53 are not hindered by outputs of the data compression circuit 55A. At a test mode, an output impedance of the data output circuit 53 becomes high under control of the test circuit 60 so that outputs of the data compression circuit 55A are not hindered by outputs of the data output circuit 53. Other elements of the third embodiment are basically similar to those of the second embodiment.

In addition, the second embodiment is designed to operate either the exclusive-or circuit 56 or the exclusive-or circuit 57 under controls of the test circuit 60. In contrast, the third embodiment is designed to simultaneously operate both of the exclusive-or circuits 56A, 57A under controls of the test circuit 60. The third embodiment may be modified to selectively operate one of the exclusive-or circuits 56A, 57A. However, because outputs of the exclusive-or circuits 56A, 57A are forwarded to different terminals, selecting one of them can be implemented by the memory tester 200 according to needs. In other words, there is no practical reason in that the semiconductor storage device 102 should selectively operate one of the exclusive-or circuits 56A, 57A.

Next, operations of the third embodiment will be described in detail.

Basically, the third embodiment operates as similar to the second embodiment. Hence, each of the exclusive-or circuits 56A, 57A inputs a prescribed data pattern to produce specific data, so that the data compression circuit 55A as a whole compresses 4-bit data read from the memory cell array 30 to 1-bit data. Specifically, in testing using a data pattern "0,0,0,0" or "1,1,1,1,", only when all bits of 4-bit data DQ0-DQ3 read from the memory cell array 30 match with each other in logical value, the exclusive-or circuit 56A produces and outputs specific 1-bit data having a logical "1" to a terminal of data DQ0.

In testing using a data pattern "0,1,0,1" or "1,0,1,0", when 4-bit data DQ0-DQ3 read from the memory cell array 30 has such a data pattern, the exclusive-or circuit 57A produces and outputs specific 1-bit data having a logical "0" to a terminal of data DQ 1. Therefore, as similar to the second embodiment, the third embodiment is capable of detecting existence of defectiveness based on outputs of the exclusive-or circuits 56A, 57A. Thus, it is possible to detect defectiveness corresponding to degeneracy of data which occur by each unit of multiple cells being subjected to simultaneous replacement.

It is described before that in the second embodiment, the select circuit 58 provides the memory tester 200 with any one of outputs of the exclusive-or circuits 56, 57. In contrast, the third embodiment does not need the select circuit 58 so that an output of the exclusive-or circuit 56A is forwarded as data DQ0 while an output of the exclusive-or circuit 57A is forwarded as data DQ1, for example. That is, the third embodiment provides the memory tester 200 with both of the outputs of the exclusive-or circuits 56A, 57A by way of different terminals.

In response to the data pattern applied to the semiconductor storage device 102 under test, the memory tester 200 selects either the data DQ0 or DQ1. Concretely speaking, if 4-bit data whose bits are all set to a same logical value are applied to the semiconductor storage device 102 under test, the memory tester 200 selects the data DQ0, which reflects an output of the exclusive-or circuit 56A, to make a decision of "pass" or "fail".

If 4-bit data corresponding to a combination of different logical values are applied to the semiconductor storage device 102 under test, the memory tester 200 selects the data DQ1, which reflects an output of the exclusive-or circuit 57A, to make a decision of "pass" or "fail". Selecting one of the data DQ0, DQ1 can be easily implemented by installing a test program onto the memory tester 200.

As described above, the third embodiment is designed to provide the memory tester 200 with both of outputs of the exclusive-or circuits 56A, 57A by way of different terminals of the data DQ0, DQ1. This eliminates the select circuit 58 and its control signals from the data compression circuit 55 of the second embodiment. Thus, it is possible to simplify the circuit configuration in the third embodiment as compared with the second embodiment.

As described heretofore, the first to third embodiments of this invention are sequentially described in conjunction with the accompanying drawings. This invention is not necessarily limited and restricted by those embodiments, hence, any changes and modifications can be embraced in the scope of this invention without departing from essential subject matter of this invention. Examples of modifications will be described below.

(1) The aforementioned embodiments use the data compression circuits 50, 55 and 55A to perform simultaneous replacement of memory cells with respect to each unit of 4-bit data DQ0-DQ3, for example. Manners of data compression employed in this invention are not necessarily limited to those embodiments. Hence, it is possible to employ any types of data compression on any combinations of data as long as the data compression is performed with respect to each unit of data being subjected to simultaneous replacement.

(2) As for testing, there are provided two types of data patterns each having a prescribed number of bits, namely, a first data pattern whose bits are all set to a same logical value and a second data pattern corresponding to a combination of different logical values, so that the second embodiment compresses each of those data patterns to specific data. It is not always necessary to provide the aforementioned two types of the data patterns. That is, it is possible to use only a data pattern consisting of plural bits corresponding to a combination of different logical values, which is solely compressed to specific data. In addition, the foregoing embodiments compress 4-bit data DQ0-DQ3 read from the memory cell array 30 to specific 1-bit data. Regardless of those embodiments, however, it is possible to perform data compression in any manners as long as original data is compressed to data having a reduced number of bits.

(3) The second embodiment provides the select circuit 58 to select either an output of the exclusive-or circuit 56 or an output of the exclusive-or circuit 57. Herein, it is possible to omit the select circuit 58 if the exclusive-or circuits 56, 57 have tristate logic that provides three possible output states, "1", "0" and "high impedance". That is, if one of the exclusive-or circuit 56, 57 is operating, the other is placed in a high-impedance state in output, so that outputs of the exclusive-or circuits 56, 57 do not compete with each other and one output of the "operating" exclusive-or circuit is forwarded to the prescribed terminal of the semiconductor storage device 10 1. Similarly, the third embodiment can be modified to employ tristate logic for the exclusive-or circuits 56A, 57A.

(4) The second embodiment activates either the exclusive-or circuit 56 or 57 to perform an exclusive-or operation on 4-bit data read from the memory cell array 30. Herein, the second embodiment can be modified as similar to the third embodiment such as to simultaneously activate both of the exclusive-or circuits 56, 57. Because the second embodiment uses the select circuit 58 to select "significant" compressed data, the data compression circuit 55 does not select "insignificant" compressed data being output from any one of the exclusive-or circuits 56, 57. For this reason, there is no problem even if the second embodiment is modified such as to simultaneously activate both of the exclusive-or circuits 56, 57.

(5) It is repeated that the second embodiment has the select circuit 58 to select one of outputs of the exclusive-or circuits 56, 57. It is possible to modify the second embodiment such that only at a test mode, tristate logic is provided for the exclusive-or circuits 56, 57 so as to selectively provide outputs. That is, under controls of the test circuit 60, the data compression circuit 55 provides one of the outputs of the exclusive-or circuit 56, 57 which selectively operate by the tristate logic.

(6) All of the foregoing embodiments describe that data compression is realized by performing an exclusive-or operation on 4-bit data to be compressed to 1-bit data. Data compression can be realized in a different manner that write data corresponding to an expected value is compared with read data to make a decision of "pass" or "fail".

(7) The foregoing embodiments exclusively refer to a DRAM as an example of the semiconductor storage device. This invention is not necessarily limited to the DRAM. That is, this invention is applicable to any types of semiconductor storage devices such as SRAMs and flash memories to an extent that the semiconductor storage devices have redundancy circuits to allow simultaneous replacement of memory cells with respect to plural bits of data.

(8) The foregoing embodiments are described under a precondition that if no defectiveness exists on the memory cell array 30, write data written to the memory cell array 30 should match with read data read from the memory cell array 30 in logical value within the semiconductor storage device. Perfect match between the write data and read data is not necessarily required in the semiconductor storage device. That is, this invention merely requires that the write data substantially and apparently match with the read data in view of the external. So, it is possible to adequately set agreements in detection of match between the write data and read data in logical value by positive logic or negative logic in response to specifics of the circuit configuration actually employed for the semiconductor storage device.

(9) The second and third embodiments use four types of data patterns for tests. This invention is not necessarily limited to use those data patterns. That is, it is possible to perform testing using a data pattern (or data patterns) arbitrarily set. In this case, it may be necessary to make modifications on the exclusive-or circuits 56, 56A, 57, 57A with respect to combinations of positive logic and negative logic in response to the data pattern(s). Of course, it is possible to increase other exclusive-or circuits in addition to the aforementioned exclusive-or circuits in order to allow detection of other data patterns. As described heretofore, this invention has a variety of effects and technical features, which will be described below.

(1) Basically, this invention provides a semiconductor storage device having a redundancy circuit for relief from defectiveness in which defect cells located on the memory cell array are replaced with redundancy cells. Namely, the semiconductor storage device of this invention comprises a data write circuit (e.g., write circuit 40) that writes data of plural bits given from the external to memory cells of the memory cell array and a data compression circuit (e.g., data compression circuits 54, 55) that performs data compression on each unit of data of a prescribed number of bits (e.g., four bits), which are subjected to simultaneous replacement by the redundancy circuit, within the data of plural bits being read from the memory cell array. Based on compressed data produced by the data compression circuit, a memory tester coupled to the semiconductor storage device makes determination as to whether a defect cell exists within memory cells which are subjected to simultaneous replacement by the redundancy circuit or not. Thus, the semiconductor storage device of this invention is capable of providing data designating the defect cell, which should be replaced with a redundancy cell, with respect to each unit of the data of the prescribed number of bits without modifying the existing memory tester. Hence, this invention eliminates necessity of capital investment in development and improvement of memory testers for testing semiconductor storage devices such as DRAMs.

(2) At a write mode, the data write circuit directly supplies the data of the plural bits to the memory cell array without compression. In other words, the data write circuit is capable of writing plural kinds of data to the memory cell array for testing. Therefore, it is possible to detect defect cells whose properties highly depend upon stored data from the memory cell array with a high accuracy.

(3) The data compression circuit is designed to compress a first type of data whose bits are all set to a same logical value. Writing such data to the memory cell array, the data compression circuit produces specific data only when all bits of data read from the memory cell array are set at the same logical value. In this case, it is possible to detect a first type of a defect cell that prevents bits of data, which are subjected to simultaneous replacement by the redundancy circuit, from being set to the same logical value.

(4) The data compression circuit is designed to compress a second type of data whose bits correspond to a prescribed combination of different logical values. Writing such data to the memory cell array, the data compression circuit produces specific data only when data read from the memory cell array have bits corresponding to the prescribed combination of different logical values. In this case, it is possible to detect a second type of a defect cell that causes degeneracy in which bits of data being subjected to simultaneous replacement are degenerated into a same logical value.

(5) The data compression circuit is configured by plural logic circuits (namely, exclusive-or circuits 56, 57) for inputting different types of data respectively and a select circuit (namely, select circuit 58) for selecting one of outputs of the plural logic circuits based on data being written to the memory cell array. Herein, the logic circuits each produce specific data when inputting prescribed different data. That is, input data accepted by one logic circuit differ from input data accepted by another logic circuit. Appropriately selecting one of outputs of the logic circuits in response to data written to the memory cell array, it is possible to compress each of the prescribed different data to specific data. Writing and reading the prescribed different data being accepted by the logic circuits on the memory cell array, the logic circuits respectively produce the specific data, based on which it is possible to detect whether write data match with read data or not. That is, it is possible to detect defect cells that bring defectiveness due to the aforementioned data.

(6) The data compression circuit contains plural logic circuits (namely, exclusive-or circuits 56A, 57A) that input prescribed different data to produce and forward specific data to different terminals regarding different data being output from the semiconductor storage device. Herein, the logic circuits each produce the specific data when inputting the prescribed different data respectively, so that outputs of the logic circuits are forwarded to the different terminals respectively. Selecting one of data being respectively output on the different terminals in response to data being written to the memory cell array, it is possible to compress each of the prescribed different data to the specific data. Writing and reading the prescribed different data on the memory cell array, the logic circuits produce and forward to the different terminals the specific data, based on which it is possible to detect whether write data match with read data or not. Thus, it is possible to detect defect cells that bring defectiveness due to the aforementioned data.

(7) One of the logic circuits is designed to produce the specific data only when a combination of different logical values is used for bits of data being written to adjacent memory cells which are subjected to simultaneous replacement with redundancy cells by the redundancy circuit. In this case, when bits of data read from the adjacent memory cells are set at a same logical value, the logic circuit does not produce the specific data. Thus, it is possible to detect a defect cell having defectiveness by which bits of data read from the adjacent memory cells are set at the same logical value.

(8) In conclusion, this invention makes decisions of "pass" and/or "fail" by comparison between write data and read data with respect to plural bits being stored in memory cells which are to be simultaneously replaced with redundancy cells at one time. Herein, decisions of "pass" are made on all of the plural bits, or a decision of "fail" is made on at least one of the plural bits, for example. For the comparison between the write data and read data, there are provided at least two types of data each having plural bits all of which are set to bring decisions of "pass", so that one of them is selected for testing in response to data written to the memory cell array.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A semiconductor storage device having a redundancy circuit for replacing defect cells on a memory cell array with redundancy cells, comprising:
   a write circuit for writing multiple-bit data given from an external to memory cells of the memory cell array; and
   a data compression circuit for performing data compression on each unit of prescribed data consisting of a prescribed number of bits, which are stored in memory cells being subjected to simultaneous replacement by the redundancy circuit, within the multiple-bit data being read from the memory cells of the memory cell array, said prescribed number of bits being a subset of bits selected from said multiple-bit data.

2. A semiconductor storage device according to claim 1 wherein the data compression circuit compresses only a first type of the prescribed data whose bits are all set to a same logical value to specific data whose number of bits is reduced as compared with the prescribed data.

3. A semiconductor storage device according to claim 2 wherein the data compression circuit is configured by an exclusive-or circuit that compresses the first type of the prescribed data to the specific data having a specific logical value.

4. A semiconductor storage device according to claim 1 wherein the data compression circuit compresses only a second type of the prescribed data consisting of the prescribed number of bits corresponding to a combination of different logical values to specific data whose number of bits is reduced as compared with the prescribed data.

5. A semiconductor storage device according to claim 4 wherein the data compression circuit is configured by an exclusive-or circuit that compresses the second type of the prescribed data to the specific data having a specific logical value.

6. A semiconductor storage device according to claim 1 wherein the multiple-bit data consists of sixteen bits while the prescribed data consists of four bits being selected from among the sixteen bits of the multiple-bit data.

7. A semiconductor storage device according to claim 1 wherein the data compression circuit is configured by a plurality of logic circuits for respectively compressing different types of the prescribed data to specific data whose number of bits is reduced as compared with the prescribed data and a select circuit for selecting one of outputs of the plurality of logic circuits in response to the multiple-bit data which are written to the memory cell array by the write circuit.

8. A semiconductor storage device according to claim 7 wherein the plurality of logic circuits correspond to a pair of a first exclusive-or circuit and a second exclusiveor circuit, wherein the first exclusive-or circuit compresses a first type of the prescribed data whose bits are all set to a same logical value to the specific data, while the second exclusive-or circuit compresses a second type of the prescribed data consisting of bits corresponding to a combination of different logical values to the specific data.

9. A semiconductor storage device according to claim 7 wherein one of the plurality of logic circuits is configured to produce the specific data only when the prescribed data consists of bits, which correspond to a combination of different logical values and which are respectively written to adjacent memory cells being subjected to simultaneous replacement by the redundancy circuit.

10. A semiconductor storage device according to claim 1 wherein the data compression circuit is configured by a plurality of logic circuits that respectively compress different types of the prescribed data to specific data, which are respectively forwarded to different terminals of different single-bit data within the prescribed data.

11. A semiconductor storage device according to claim 10, wherein one of the plurality of logic circuits is configured to produce the specific data only when the prescribed data consists of bits, which correspond to a combination of different logical values and which are respectively written to adjacent memory cells being subjected to simultaneous replacement by the redundancy circuit.

12. A semiconductor storage device having a redundancy circuit for replacing defect cells on a memory cell array with redundancy cells, comprising:
    a write circuit for writing multiple-bit data given from an external to memory
    a data compression circuit for performing data compression on each unit of prescribed data consisting of a prescribed number of bits, which are stored in memory cells being subjected to simultaneous replacement by the redundancy circuit, within the multiple-bit data being read from the memory cells of the memory cell array, wherein said data compression circuit compresses only a first type of the prescribed data whose bits are all set to a same logical value to specific data whose number of bits is reduced as compared with the prescribed data.

13. A semiconductor storage device according to claim 12 wherein the data compression circuit is configured by an exclusive-or circuit that compresses the first type of the prescribed data to the specific data having a specific logical value.

14. A semiconductor storage device having a redundancy circuit for replacing defect cells on a memory cell array with redundancy cells, comprising:

a write circuit for writing multiple-bit data given from an external to memory cells of the memory cell array; and a data compression circuit for performing data compression on each unit of prescribed data consisting of a prescribed number of bits, which are stored in memory cells being subjected to simultaneous replacement by the redundancy circuit, within the multiple-bit data being read from the memory cells of the memory cell array, wherein said data compression circuit compresses only a second type of the prescribed data consisting of the prescribed number of bits corresponding to a combination of different logical values to specific data whose number of bits is reduced as compared with the prescribed data.

15. A semiconductor storage device according to claim 14 wherein the data compression circuit is configured by an exclusive-or circuit that compresses the second type of the prescribed data to the specific data having a specific logical value.

16. A semiconductor storage device having a redundancy circuit for replacing defect cells on a memory cell array with redundancy cells, comprising:

a write circuit for writing multiple-bit data given from an external to memory a data compression circuit for performing data compression on each unit of prescribed data consisting of a prescribed number of bits, which are stored in memory cells being subjected to simultaneous replacement by the redundancy circuit, within the multiple-bit data being read from the memory cells of the memory cell array, wherein the multiple-bit data consists of sixteen bits while the prescribed data consists of four bits being selected from among the sixteen bits of the multiple-bit data.

17. A semiconductor storage device having a redundancy circuit for replacing defect cells on a memory cell array with redundancy cells, comprising:

a write circuit for writing multiple-bit data given from an external to memory cells of the memory cell array; and a data compression circuit for performing data compression on each unit of prescribed data consisting of a prescribed number of bits, which are stored in memory cells being subjected to simultaneous replacement by the redundancy circuit, within the multiple-bit data being read from the memory cells of the memory cell array, wherein the data compression circuit is configured by a plurality of logic circuits for respectively compressing different types of the prescribed data to specific data whose number of bits is reduced as compared with the prescribed data and a select circuit for selecting one of outputs of the plurality of logic circuits in response to the multiple-bit data which are written to the memory cell array by the write circuit.

18. A semiconductor storage device according to claim 17 wherein the plurality of logic circuits correspond to a pair of a first exclusive-or circuit and a second exclusive-or circuit, wherein the first exclusive-or circuit compresses a first type of the prescribed data whose bits are all set to a same logical value to the specific data, while the second exclusive-or circuit compresses a second type of the prescribed data consisting of bits corresponding to a combination of different logical values to the specific data.

19. A semiconductor storage device according to claim 17 wherein one of the plurality of logic circuits is configured to produce the specific data only when the prescribed data consists of bits, which correspond to a combination of different logical values and which are respectively written to adjacent memory cells being subjected to simultaneous replacement by the redundancy circuit.

20. A semiconductor storage device having a redundancy circuit for replacing defect cells on a memory cell array with redundancy cells, comprising:

a write circuit for writing multiple-bit data given from an external to memory cells of the memory cell array; and a data compression circuit for performing data compression on each unit of prescribed data consisting of a prescribed number of bits, which are stored in memory cells being subjected to simultaneous replacement by the redundancy circuit, within the multiple-bit data being read from the memory cells of the memory cell array, wherein the data compression circuit is configured by a plurality of logic circuits that respectively compress different types of the prescribed data to specific data, which are respectively forwarded to different terminals of different single-bit data within the prescribed data.

21. A semiconductor storage device according to claim 20 wherein one of the plurality of logic circuits is configured to produce the specific data only when the prescribed data consists of bits, which correspond to a combination of different logical values and which are respectively written to adjacent memory cells being subjected to simultaneous replacement by the redundancy circuit.

* * * * *